United States Patent
Wright

(10) Patent No.: US 7,940,082 B1
(45) Date of Patent: May 10, 2011

(54) CIRCUITS AND METHOD FOR BYPASSING A STATIC CONFIGURATION IN A PROGRAMMABLE LOGIC DEVICE TO IMPLEMENT A DYNAMIC MULTIPLEXER

(75) Inventor: Adam J. Wright, Saratoga, CA (US)

(73) Assignee: Altera Corporation, San Jose, CA (US)

( * ) Notice: Subject to any disclaimer, the term of this patent is extended or adjusted under 35 U.S.C. 154(b) by 336 days.

(21) Appl. No.: 12/053,183

(22) Filed: Mar. 21, 2008

Related U.S. Application Data

(60) Provisional application No. 61/017,527, filed on Dec. 28, 2007.

(51) Int. Cl.
*H03K 19/177* (2006.01)
(52) U.S. Cl. ............... 326/40; 326/38; 326/46; 326/113
(58) Field of Classification Search ............. 326/37–41, 326/47; 365/226–227; 713/320–321
See application file for complete search history.

(56) References Cited

U.S. PATENT DOCUMENTS

| | | | |
|---|---|---|---|
| 6,078,191 A * | 6/2000 | Chan et al. | 326/40 |
| 6,621,296 B2 * | 9/2003 | Carberry et al. | 326/40 |
| 7,019,557 B2 * | 3/2006 | Madurawe | 326/38 |

* cited by examiner

*Primary Examiner* — James H. Cho
*Assistant Examiner* — Christopher Lo
(74) *Attorney, Agent, or Firm* — Martine Penilla & Gencarella, LLP

(57) ABSTRACT

Circuit for selectively using static or dynamic select signals inside an integrated circuit, including a first transistor connecting a static select signal to a dynamic route select output line when a dynamic select CRAM signal is at a first logical level, and a second transistor connecting a dynamic select signal to the dynamic route select output line when the dynamic select CRAM signal is at a second logical level. The circuit further comprises a dynamic select CRAM register that contains a logical value to indicate whether the dynamic select signal bypasses the static select signal. The dynamic select CRAM register is connected to the second transistor gate, and to an inverter whose output is connected to the first transistor gate.

17 Claims, 8 Drawing Sheets

| DS0 | DS1 | DR0' | DR1' | SS |
|---|---|---|---|---|
| 0 | 0 | 0 | 0 | 0 |
| 0 | 1 | 0 | 1 | 0 |
| 1 | 0 | 1 | 0 | 0 |
| 1 | 1 | 0 | 1 | 1 |

CIRCUITS AND METHOD FOR BYPASSING A STATIC CONFIGURATION IN A PROGRAMMABLE LOGIC DEVICE TO IMPLEMENT A DYNAMIC MULTIPLEXER

CROSS REFERENCE TO RELATED APPLICATIONS

This application claims priority from U.S. Provisional Patent Application No. 61/017,527, filed Dec. 28, 2007, and entitled "Circuits and Methods for Bypassing a Static Configuration in a Programmable Logic Device to Implement a Dynamic Multiplexer." This provisional application is herein incorporated by reference.

BACKGROUND

A Programmable Logic Device is an electronic component used to build reconfigurable digital circuits. Unlike a logic gate, which has a fixed function, a PLD has an undefined function at the time of manufacture, and it must be programmed before the PLD can be used in a circuit. PLDs use routing multiplexers with static configurations to implement programmable routing structures. The routing structures often include chained multiplexing stages, where the outputs of one stage are connected to the inputs of the next stage. The chained multiplexing stages, also called multi-stage multiplexers, enable the optimization in size and efficiency of the circuitry in the PLD.

PLDs contain logic elements (LE) that perform basic logic functions on the inputs to the LEs and communicate the results via the output lines leaving the LEs. A group of LEs are combined into a Logic Array Block (LAB). Typically, LABs contain routing lines and multiplexers to provide the inputs to the LEs, and to communicate the outputs from the LEs to other LEs inside the LAB or to other entities outside the LAB. Often, the interconnections between the different modules are designed in advance creating static multiplexing routes. Because these routing connections are static, the multiplexers merely act as routing mechanisms and cannot be used as multiplexers in user designs.

PLD configurations are stored as a bit sequence and are loaded during the programming phase of the PLD. Because the bits are static, testing the functionality of the different multiplexers statically configured requires loading different bit configurations and testing each configuration. Loading configurations is a relatively time consuming process that slows down testing.

It is in this context that embodiments of the invention arise.

SUMMARY

Embodiments of the present invention provide circuits and methods for selectively using static or dynamic signals inside an integrated circuit to control a multiplexer. Other embodiments implement a user multiplexer by cascading a plurality of multiplexers in conjunction with the capability to bypass static signals with dynamic signals. Embodiments of the current invention also provide for improved testing methodology that bypasses static select signals with dynamic select signals, thus enabling testing several multiplexer configurations without the need to reload static Configuration Random Access Memory (CRAM) configurations in a Programmable Logic Device.

It should be appreciated that the present invention can be implemented in numerous ways, such as a process, an apparatus, a system, a device or a method on a computer readable medium. Several inventive embodiments of the present invention are described below.

In one embodiment, a circuit for selectively using static or dynamic select signals inside an integrated circuit is provided. The circuit includes two transistors, whereby only one transistor is turned on at a given time to select either a static or a dynamic select signal. The first transistor connects the static select signal to an output line, and the second transistor connects the dynamic select signal to the output line. Which transistor is turned on depends on the value of a dynamic select CRAM signal, whereby the first transistor is turned on when the dynamic select CRAM signal is at a first logical level, or the second transistor is turned on when the dynamic select CRAM signal is at a second logical level.

In another embodiment, a circuit for implementing a dynamic multiplexer by cascading multiplexers is presented. The circuit uses bypass circuitry to allow the use of dynamic select signals for the multiplexer. The bypass circuitry also generates a sneak select signal that allows sneak in circuitry to combine the input signals in one logical module, with the input signals from another logical module.

In another embodiment, a method for testing a multiplexer is presented. The method uses dynamic select signals that bypass static select signals, where the static select signals are loaded from a circuit configuration file. When using static select signals, the configuration file has to be loaded every time a new signal configuration for the multiplexer is tested. On the other hand, using dynamic select signals allows testing the different variations of select signals to the multiplexer by merely changing the dynamic select signals.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings in which:

FIG. 5B shows a logic table for the bypass circuit seen in FIG. 5A.

DETAILED DESCRIPTION

A circuit for selectively using static or dynamic select signals inside an integrated circuit is provided. The circuit includes a first transistor connecting a static select signal to a dynamic route select output line when a dynamic select CRAM signal is at a first logical level, and a second transistor connecting a dynamic select signal to the dynamic route select output line when the dynamic select CRAM signal is at a second logical level. The circuit further comprises a dynamic select CRAM register that contains a logical value to indicate whether the dynamic select signal bypasses the static select signal. The dynamic select CRAM register is connected to the second transistor gate, and to an inverter whose output is connected to the first transistor gate. Thus, the content of the select CRAM register determines whether the static or the dynamic select signal is propagated.

The circuit can be replicated to a plurality of dynamic/static signal pairs that are controlled by the dynamic select CRAM register. This way, all the select signals are bypassed at the same time to use dynamic select signals in a multiplexer. In other embodiment, the different pairs of dynamic/static signals can be controlled by different dynamic select CRAM registers providing further flexibility in the configuration and use of the PLD.

In another embodiment, a circuit for implementing a dynamic multiplexer by cascading multiplexers is presented. The circuit comprises a set of first multiplexers that have common select signals, a second multiplexer that receives the outputs from the set of first multiplexers, and bypassing circuitry to selectively use dynamic or static select signals for the second multiplexer. The circuit further comprises a sneak select circuit that connects, via sneak in connections, the outputs of first multiplexers outside a master LEIM to the output of the second multiplexer. The sneak in connections are activated by sneak select signals. In other embodiment, the first multiplexers do not share the common select signals.

The embodiments described in this application are based on a three-stage static multiplexer design. The bypass circuitry described as an example is implemented in the second stage. However, the person skilled in the art will easily appreciate that the same concepts could be used for any other stage, such as the first stage of multiplexers. The present invention may be practiced without some or all of these specific details. In other instances, well known process operations have not been described in detail in order not to unnecessarily obscure the present invention.

Figure 1:
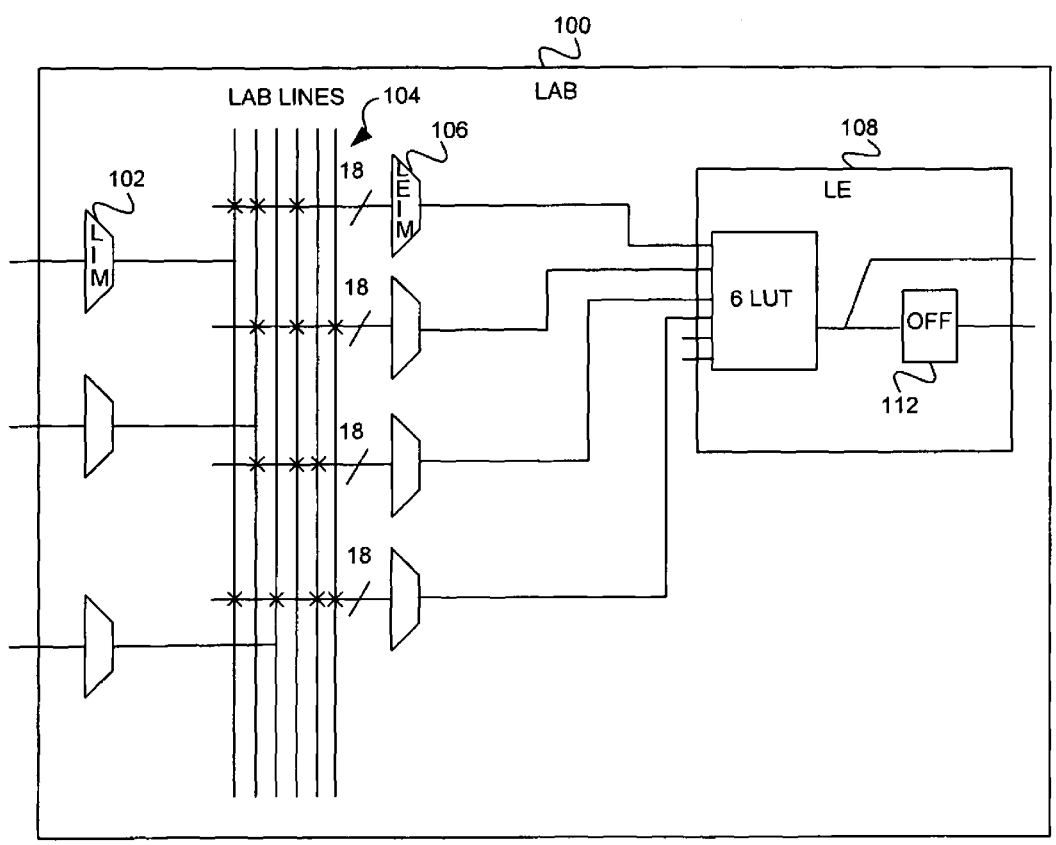
FIG. 1 depicts the main components of a LAB.

FIG. 1 depicts the main components of a LAB. A LAB 100 includes a set of Logical Elements (LE) 108 that perform basic logic functions. A typical LE 108 contains a LookUp Table (LUT) 110 and other structures such as Digital Flip Flops 112 or adders. Shown is a 6-LUT with 6 inputs, but other LUT configurations are also common, such as 3-LUT, 4-LUT, etc. Input signals to the LAB are connected to LAB Input Multiplexers (LIM) 102. The LIMs 102 select signals from a set of routing wires and drive the selected signals onto a set of LAB lines 104 that are internal to LAB 100. Wire connections at LAB lines 104 determine the input to LE Input Multiplexers 106, which in turn outputs signals multiplexed from the inputs to LE 108.

Figure 2:
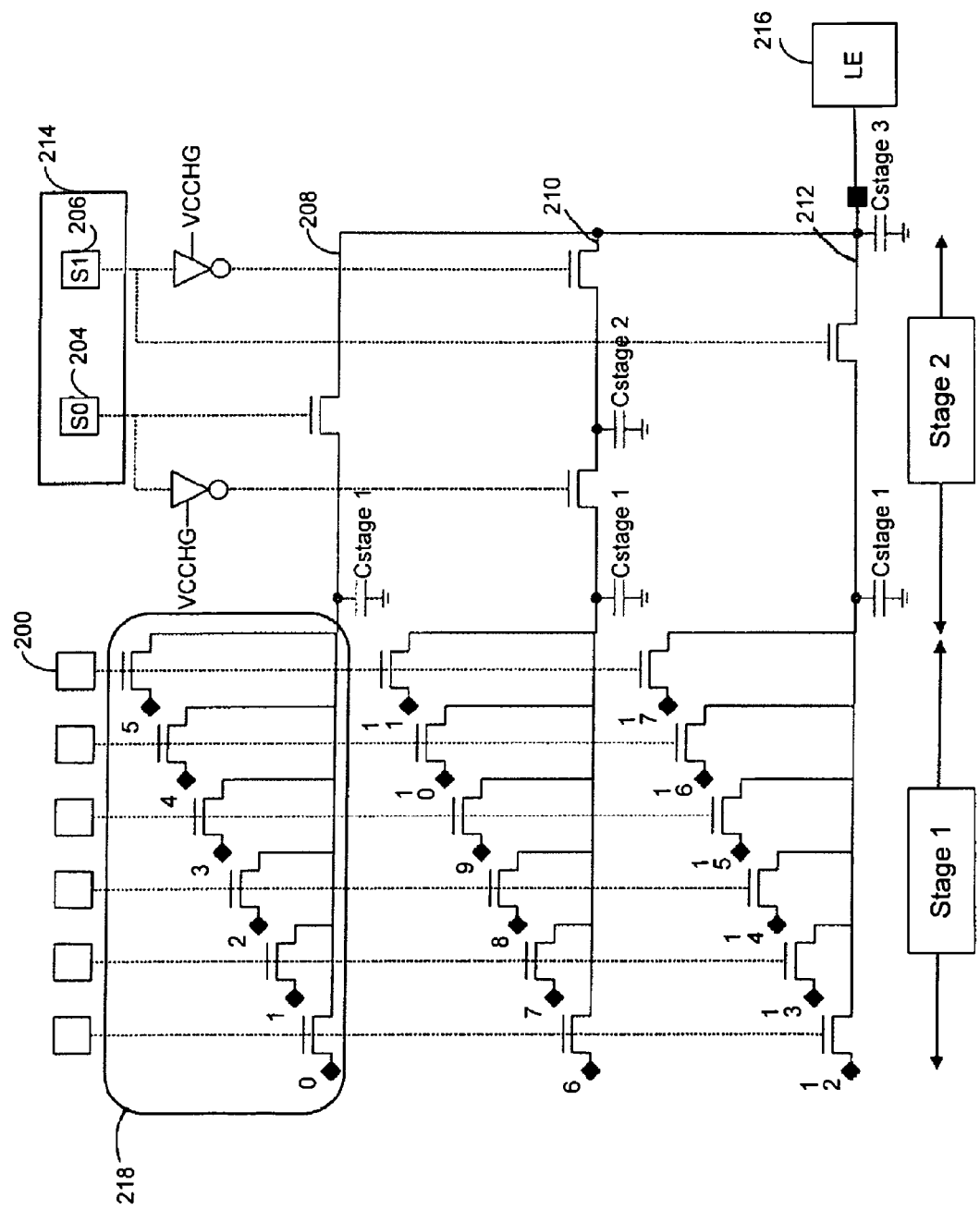
FIG. 2 shows a static routing circuit using multiplexers in two separate stages according to one embodiment.

FIG. 2 shows a static routing circuit using multiplexers in two separate stages according to one embodiment. In the first stage of the circuit seen at the left of FIG. 2, three 6:1 first stage multiplexers 218 are shown in "parallel." By parallel, it is meant that the first stage multiplexers 218 share the same select signals. CRAM bits 200 from a PLD configuration file drive the select signals for first stage multiplexers 218. By combining the three 6:1 multiplexers, one 18:3 multiplexer is created in the first stage. The 3 outputs of the 18:3 multiplexer are related because first stage multiplexers 218 share the select signals, as mentioned earlier. For example, the output of stage 1 can be input bits 0, 6, and 12; or 1, 7 and 13; or 2, 8 and 14; etc.

The second stage implements a 3:1 multiplexer by selecting one of the three outputs from stage 1 that are chosen according to the associated dynamic select circuitry 214. One embodiment for dynamic select circuitry 214 is described below with respect to FIG. 3. If dynamic select circuitry 214 makes use of static select signals 204 (S0) and 206 (S1), the output of the second stage will be the line 208 coming out of the top first multiplexer when S0 is at a logic high. If S0 and 51 are both at logic low, then the output of the second stage will be the line 210 coming out of the middle first multiplexer. If 51 is logic high the output of the second stage will be the line 212 coming out of the bottom first multiplexer. Combining the three 6:1 multiplexers in the first stage, with the 3:1 multiplexer of the second stage creates a 18:1 multiplexer. The output of the second stage can be connected to a third stage, such as LE 216. Although n-type Metal Oxide Semiconductor (NMOS) transistors have been used in the described embodiment, the person skilled in the art will appreciate that similar results can be achieved by using p-type Metal Oxide Semiconductor (PMOS) transistors. NMOS transistors are turned 'ON' when a logic high is applied to the NMOS transistor gate, while PMOS transistors are turned 'ON' when a logic low is applied to their gates.

The term static select signal, as used herein, refers to a select signal derived from the content of CRAM bits loaded from a configuration file, that is, the select signal is static because it does not change once a PLD is programmed with the CRAM bits. On the other hand, the term dynamic select signal refers to signals derived from sources that can change during the normal operation of a PLD after the PLD has been programmed, that is, the select signal is dynamic because it can change over time without having to reload the CRAM bits.

Figure 3:
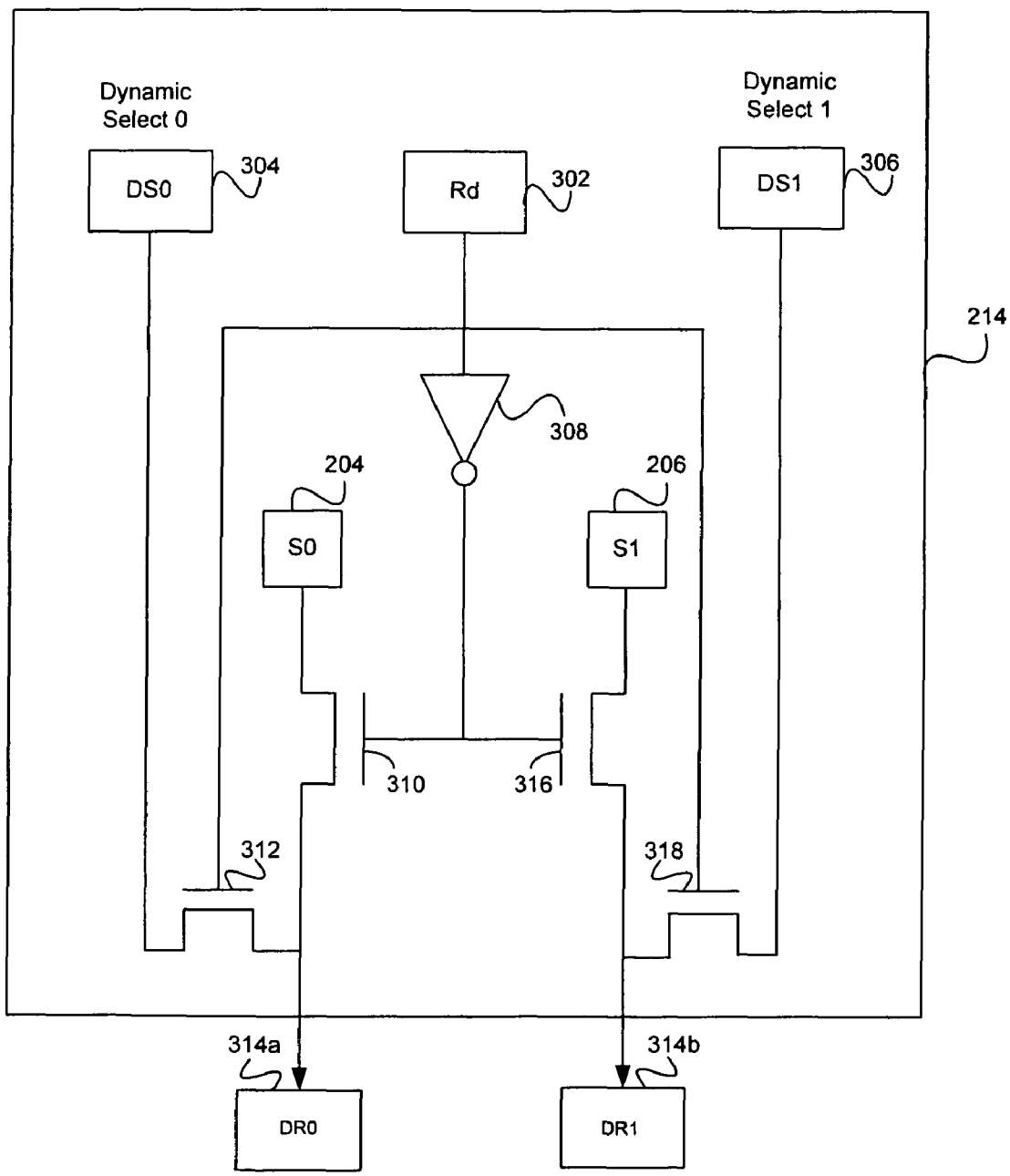
FIG. 3 shows a bypass circuit to selectively use dynamic routing signals according to one embodiment.

FIG. 3 shows a bypass circuit to selectively use dynamic routing signals according to one embodiment. Dynamic select circuitry 214, as seen in FIG. 3, comprises two static select signals 204 (S0) and 206 (S1); and two dynamic select signals 304 (DS0) and 306 (DS1). The circuit further includes dynamic select CRAM register 302 whose output is connected to the gates of second transistor 312 and fourth transistor 318. When dynamic select CRAM register 302 contains a logic high value, second transistor 312 and fourth transistor 318 connect the dynamic select signals to the corresponding dynamic route select output line 314a and 314b.

Inverter 308 connects dynamic select CRAM register 302 to the gates of first transistor 310 and third transistor 316, whereby first transistor 310 and third transistor 316 connect static select signals 204 and 206 to the corresponding dynamic route select output line 314a or 314b when dynamic select CRAM register 302 contains a logic value of low. In summary, the contents of dynamic select CRAM register 302 determines whether the static or the dynamic select signals are transferred to the output lines. If the static select signals are output, then a standard static configuration is used for the multiplexer as found in the CRAM bits of the configuration file. If the dynamic select signals are output, then the second stage in FIG. 2 behaves as a dynamic 3:1 multiplexer where the select signals can dynamically change according to the values of the dynamic select signals 304 and 306. The dynamic select signals 304 and 306 can originate at different parts of the circuitry, such as an input line to the integrated circuit, a register inside the integrated circuit, a register in the PLD, a register inside the LAB, a register outside the PLD, etc.

While an implementation of two static and two dynamic select signals has been described, the concept can be easily expanded to more select signals. This requires the addition of two transistors per dynamic select route line, one to connect the static select signal, and one to connect the dynamic select signal. It should be appreciated that this circuit does not add any load to the user signal path, and therefore it does not affect the maximum operating frequency for the circuit.

Figure 4:
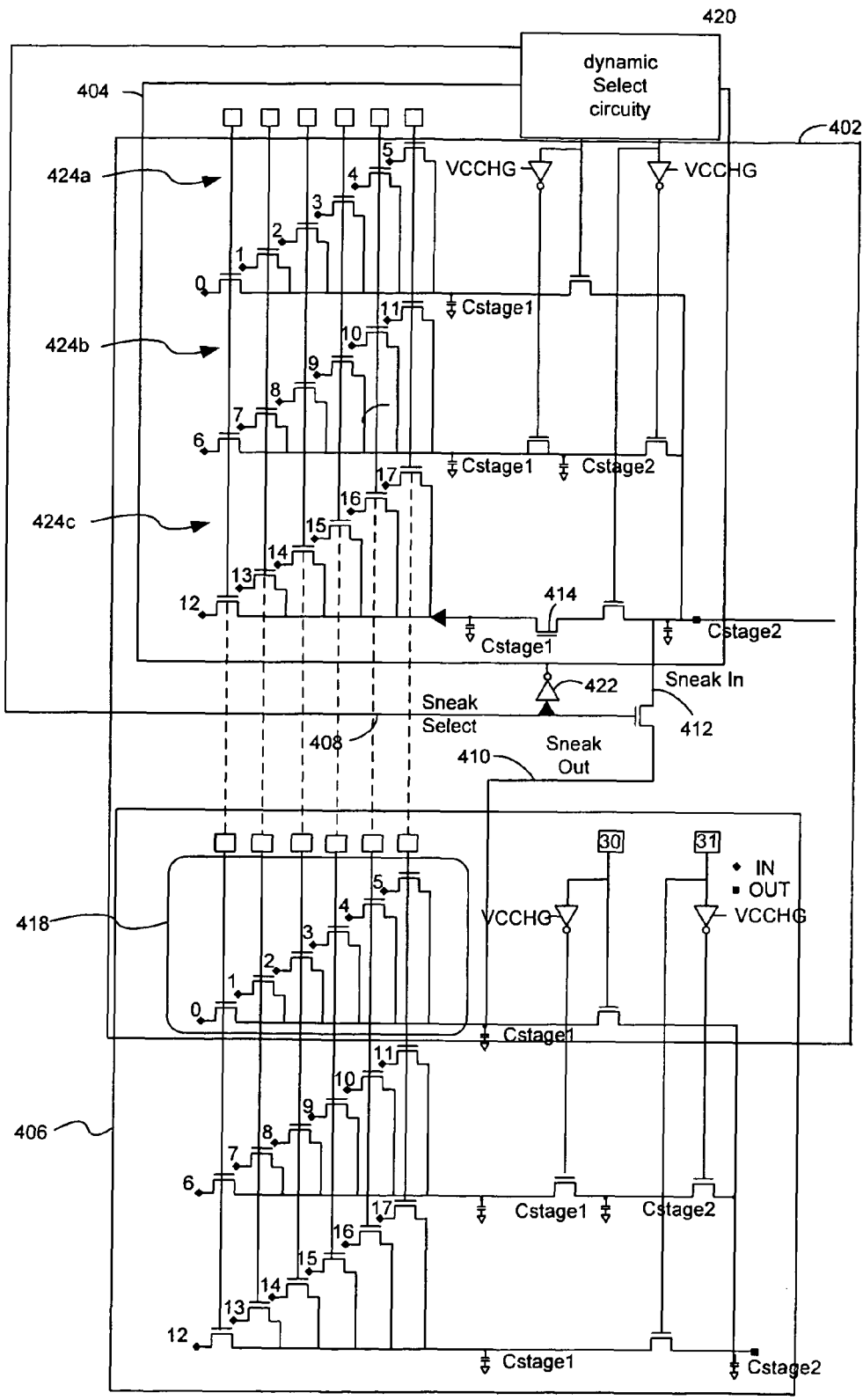
FIG. 4 describes a circuit to cascade multiplexers in two different LEIMs, according to one embodiment of the invention.

FIG. 4 describes a circuit to cascade multiplexers in two different LEIMs, according to one embodiment of the invention. While the combination of two LEIMS is described here, the concept can be expanded to any combination of multi-stage multiplexers inside a PLD. In this context, "cascading a multiplexer," refers to aggregating a multiplexer or multiplexers from one LEIM to multiplexers from another LEIM in order to implement a larger multiplexer.

A 4:1 dynamic multiplexer 402 is created by combining elements from two different LEIMs, master LEIM 404 and slave LEIM 406. The LEIMs have been named master and slave to facilitate the description of the combination without any other implication to the relationship between the two LEIMs. One LEIM is named master LEIM 404 because the stage 2 circuitry from master LEIM 404, as described with respect to FIG. 2, is used to implement the stage 2 circuitry of the combination. In this embodiment, the stage 2 circuitry of slave LEIM 406 is available, together with the other unused first stage multiplexers, to be used for any other general purpose by the circuit designer.

To cascade multiplexers from one LEIM and combine them with multiplexers in another LEIM, sneak circuitry is provided to combine the outputs of the different LEIMs. In this embodiment, three 6:1 first stage multiplexers from master LEIM 404 are combined with cascaded multiplexer 418 from slave LEIM 406. The four first-stage multiplexers share select signals, but in another embodiment, the cascaded multiplexer can have different select signals loaded from the CRAM bit configuration. Dynamic select circuitry 420 is used to bypass the static select signals with dynamic select signals, and to generate the sneak select signal 408 that controls the cascading of the output from cascaded multiplexer 418. Details for one embodiment of dynamic select circuitry 420 are described below with respect to FIGS. 5A and 5B.

Sneak select signal 408 determines when the output of cascaded multiplexer 418 is used for the output of 4:1 dynamic multiplexer 402. Sneak select 408 is connected to the gate of sneak out transistor 416, and to the gate of sneak block transistor 414 via inverter 422. When sneak select signal 408 is activated, that is, when sneak select signal 408 is logic high, sneak out select signal 410 is connected to the exit of dynamic multiplexer 402 via sneak in 412 connection. In addition, when sneak select signal 408 is activated sneak block transistor 414 disconnects the exit from the bottom first multiplexer in master LEIM 404, while the other first multiplexers 424a, 424b and 424c in master LEIM 404 are disconnected from the output by the stage two circuitry of master LEIM 404.

In summary, the output of the first multiplexer in slave LEIM 406 is cascaded with the tree outputs from the first multiplexers in master LEIM 404 to form a 4:1 multiplexer. The person skilled in the art will appreciate that many similar combinations to the one described here are possible following the basic principles put forward. For example, sneak block transistor 414 could be placed at the beginning of the stage 3 in one embodiment, thereby blocking all the output lines from master LEIM 404 at the same time. Sneak in transistor 412 could be located after sneak block transistor 414 allowing the signal from cascaded multiplexer 418 to be "sneaked in" to the output of stage 2. The placement of the transistors will depend on the logic used in dynamic select circuitry 420.

Figure 5A:
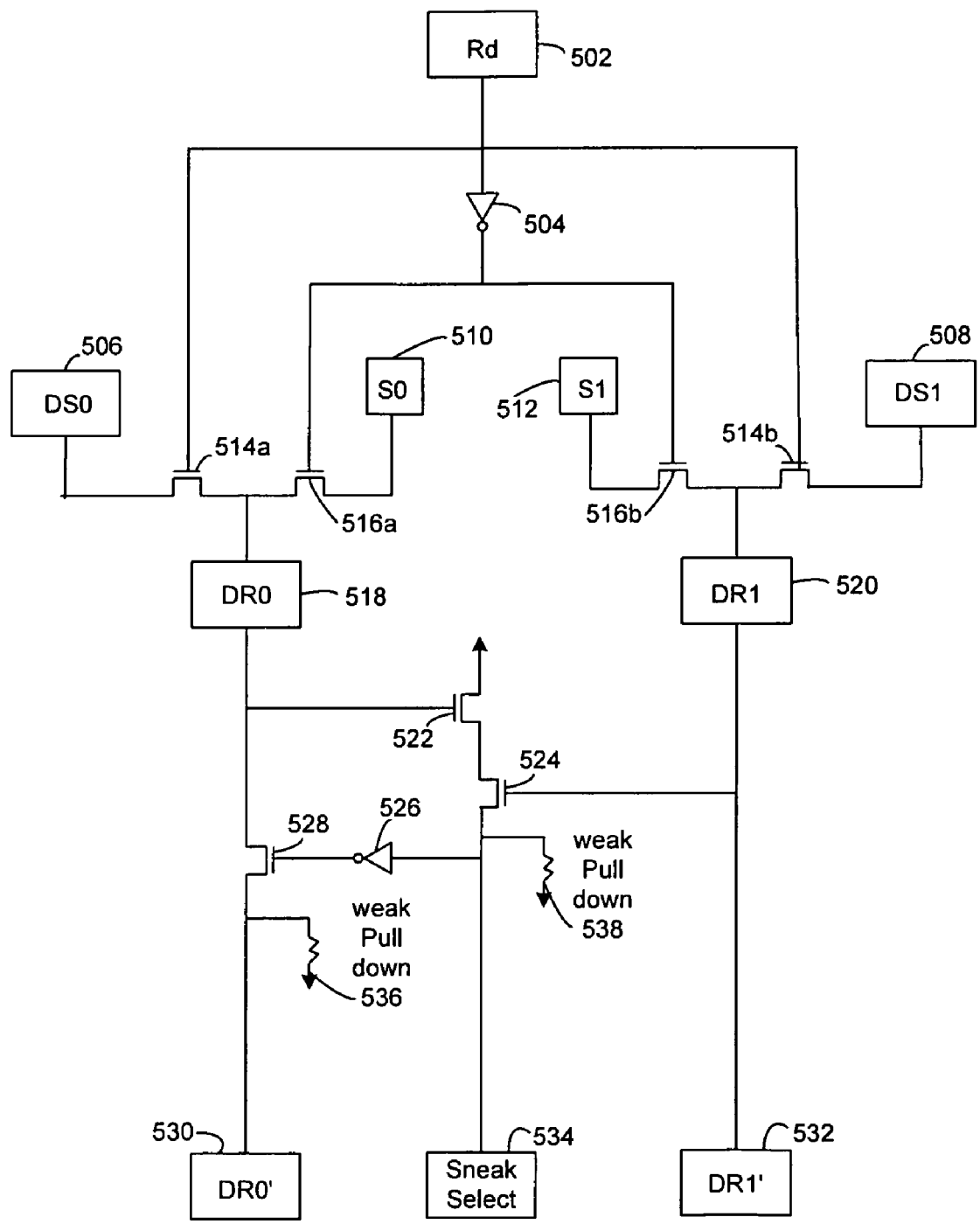
FIG. 5A depicts a bypass circuit to cascade multiplexers according to one embodiment.

FIG. 5A depicts a bypass circuit to cascade multiplexers according to one embodiment. The top section of dynamic select circuitry 500 is similar to the circuit previously described in FIG. 3. A dynamic select CRAM register is connected to the gates of third transistor 514a and fourth transistor 514b, whereby when the third and fourth transistors are activated, dynamic signals 506 (DS0) and 508 (DS1) are output to the bottom part of the dynamic select circuit 500 over first intermediate output line 518 (DR0) and second intermediate output line 520 (DR1). When the dynamic select CRAM register turns off third transistor 514a and fourth transistor 514b, then first transistor 516a and second transistor 516b are turned on because the first and second transistors are connected to dynamic select CRAM register 502 via inverter 504, causing the circuit to use static select signals 510 (S0) and 512 (S1) instead of the dynamic select signals.

The purpose of the bottom half of the circuit is to generate the sneak select signal used to cascade outside multiplexers, and to modify the dynamic select signals if necessary to avoid 'collision' of outputs. For example, in the circuit described in FIG. 2 that combines 3 input lines, one line is selected if s0 is logic high, another line if s1 is logic high, and the third line if both s0 and s1 are logic low at the same time. This circuit does not leave any open combinations for cascading, because the combination where s0 and s1 are both logic high at the same time would cause the signals from two first multiplexers to 'collide.' Therefore, the dynamic select circuitry must be adjusted to accomplish the four different cases required to implement the 4:1 multiplexer.

Now referring back to FIG. 5A, sneak select signal 534 is obtained by connecting a logic high through fifth 522 and sixth 524 transistors, whose gates are connected to the first and second intermediate output lines, creating as a result a sneak select signal with a value of logic high when both intermediate output lines have a logic value of high. Weak pull down resistor 538 connects sneak select signal 534 to ground, thereby making sneak select signal logic low in all other cases where the intermediate output lines are not logic high at the same time. Second intermediate output line 520 (DR1), is connected with a direct wire to the output line and becomes second dynamic select output line 532 (DR1'). First intermediate output line 518 is connected via a seventh 528 transistor to first dynamic select output line 530 (DR0'), where the seventh transistor's gate is connected to the sneak select signal via inverter 526. A weak pull down resistor 536 connects DR0' to ground in order to prevent DR0' from floating.

FIG. 5B shows a logic table for the bypass circuit seen in FIG. 5A. When both DS0 and DS1 are logic low, or when only one of DS0 and DS1 is logic high, both DS0 and DS1 become the dynamic signals and are transferred out of dynamic select signal 500 of FIG. 5A, and the sneak select signal SS is logic low. However, when both DS0 and DS1 are logic high at the same time, DS0 becomes logic low DR0'; DS0 is still logic high at the exit as DR1'; and the select signal gets a value of logic high.

Figure 6:
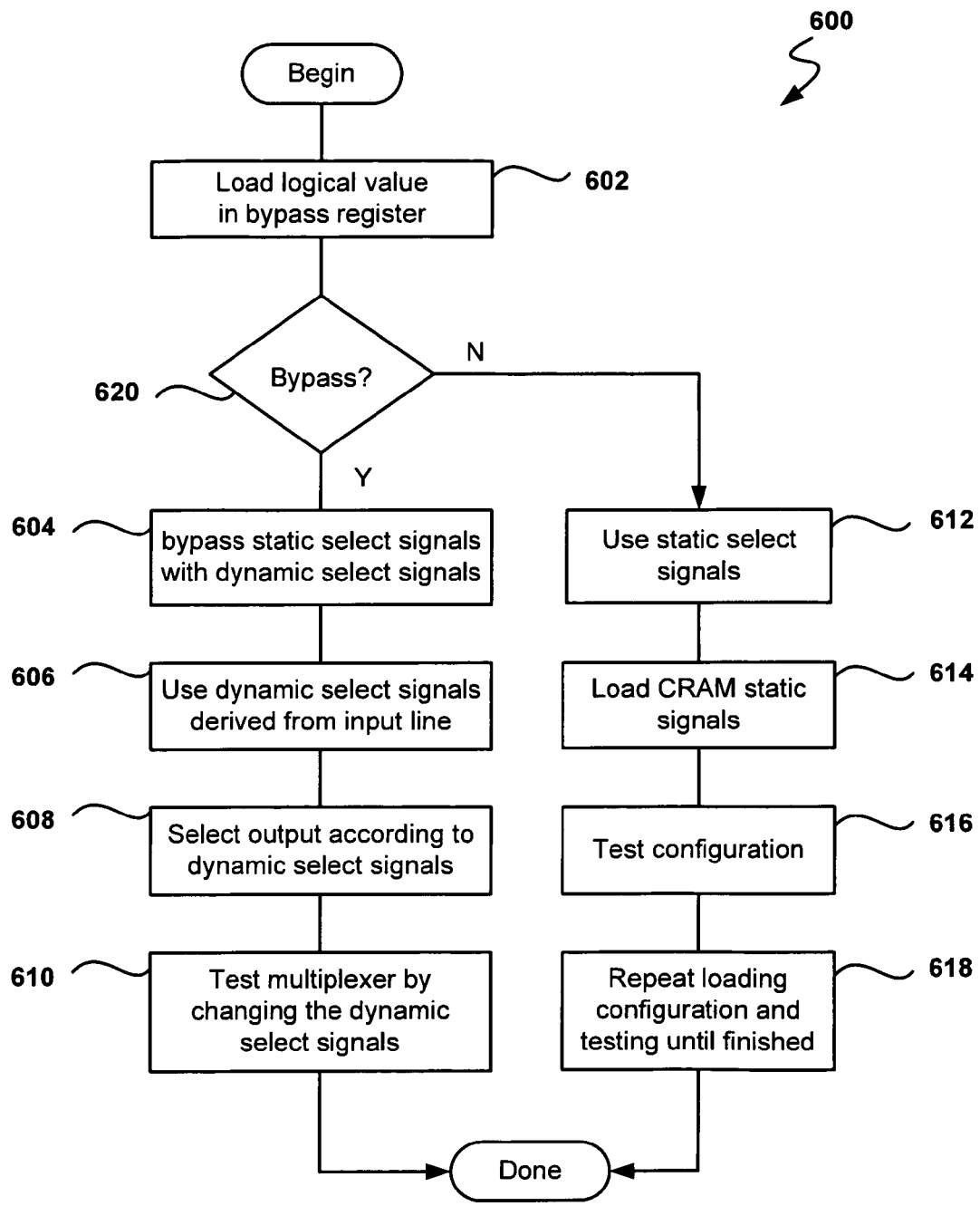
FIG. 6 describes the process flow for testing a multiplexer in an integrated circuit in accordance with one embodiment of the invention.

FIG. 6 describes the process flow for testing a multiplexer in an integrated circuit in accordance with one embodiment of the invention. In operation 602 a logical value is loaded in a bypass register, such as dynamic select CRAM register 302 of FIG. 3. This logical value indicates whether static signals should be used, or whether the static signal or signals should be bypassed with dynamic select signals. In operation 620, the register contents are checked to determine whether to bypass the static select signals. If bypassing is not selected, then the process continues at operation 612 indicating that static select signals, such as static select S0 510 and static select S1 512 of FIG. 5A, will be used for the testing. Following operation 612, the CRAM bits are loaded from a circuit configuration into the static select signal registers in operation 614. The testing of the circuit is done in operation 616, and the process of loading and testing a static configuration is repeated until all the desired configurations are tested.

However, if the bypass register indicates bypassing of the static select signals, the process continues to operation 604. Following operation 604, the dynamic select signals, such as DS0 506 and DS1 508 in FIG. 5A, are derived from an input line in operation 606. In other embodiments, the dynamic signals can be derived from registers in the integrated circuit being tested, or from registers outside the integrated circuit. In operation 608, the dynamic select signals determine the output or outputs selected from the multiplexer being tested, followed by testing the multiplexer in operation 610. Several tests can be done in operation 610 by changing the dynamic select signals without having to reload the configuration, in contrast with operation 618 that requires the reloading of each static configuration to be tested. Not having to reload the CRAM configuration can reduce the multiplexer testing overhead by more than fifty percent.

Figure 7:
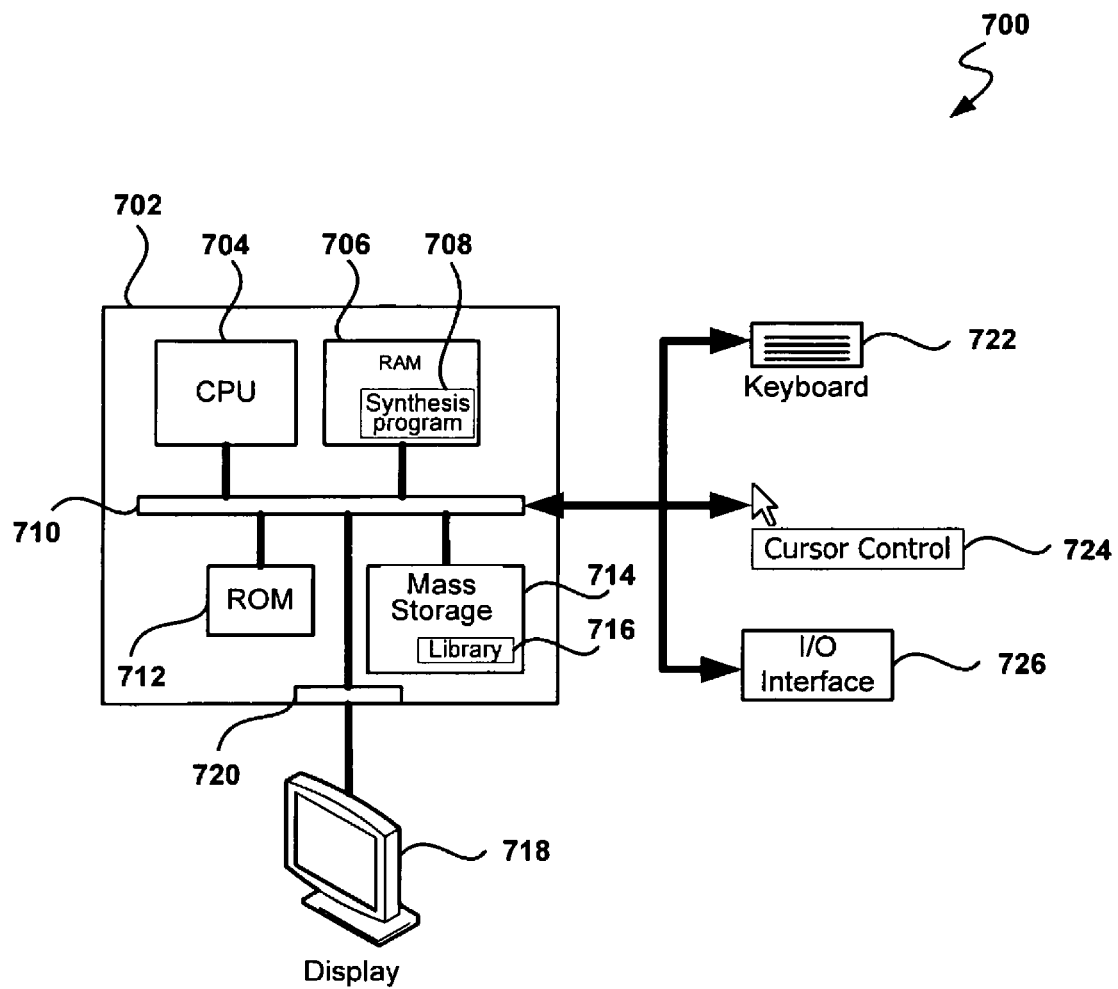
FIG. 7 is a simplified schematic diagram of a computer system for implementing embodiments of the present invention.

FIG. 7 is a simplified schematic diagram of computer system 700 for implementing embodiments of the present invention. It should be appreciated that the methods described herein may be performed with a digital processing system, such as a conventional, general-purpose computer system. Special purpose computers, which are designed or programmed to perform only one function may be used in the alternative. In addition, the computer system of FIG. 7 may be used to test a PLD. The computer system includes a central processing unit (CPU) 704, which is coupled through bus 710 to random access memory (RAM) 706, read-only memory (ROM) 712, and mass storage device 714. Testing program 708 resides in random access memory (RAM) 706.

Mass storage device 714 represents a persistent data storage device such as a floppy disc drive or a fixed disc drive, which may be local or remote. Library 716 resides in mass storage device 714. Library 716 may contain program instructions for testing. It should be appreciated that CPU 704 may be embodied in a general-purpose processor, a special purpose processor, or a specially programmed logic device. Display 718 is in communication with CPU 704, RAM 706, ROM 712, and mass storage device 714, through bus 710 and display interface 720. Of course, display 718 is configured to display the user interfaces described herein. Keyboard 722, cursor control 724, and input/output interface 726 are coupled to bus 710 in order to communicate information in command selections to CPU 704. It should be appreciated that data to and from external devices may be communicated through input output interface 726.

Embodiments of the present invention may be practiced with various computer system configurations including handheld devices, microprocessor systems, microprocessor-based or programmable consumer electronics, minicomputers, mainframe computers and the like. The invention can also be practiced in distributed computing environments where tasks are performed by remote processing devices that are linked through a wire-based or wireless network.

The resulting circuit design, described herein may be employed with any integrated circuit, such as processors, programmable logic devices (PLDs) and factory programmed devices. Exemplary PLDs include but are not limited to a programmable array logic (PAL), programmable logic array (PLA), field programmable logic array (FPLA), electrically programmable logic devices (EPLD), electrically erasable programmable logic device (EEPLD), and field programmable gate array (FPGA). Factory programmed devices include but are not limited to application specific standard product (ASSP), application specific integrated circuit (ASIC), and standard cell array, just to name a few. Programmable and factory programmed devices can have internal logic, assuming the functions of the bit event logic, and integrated SerDes resulting in more-compact and lower-cost solutions.

With the above embodiments in mind, it should be understood that the invention can employ various computer-implemented operations involving data stored in computer systems. These operations are those requiring physical manipulation of physical quantities. Usually, though not necessarily, these quantities take the form of electrical or magnetic signals capable of being stored, transferred, combined, compared and otherwise manipulated.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can also be distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A circuit for selectively using static or dynamic select signals inside an integrated circuit, the circuit comprising:
   a first transistor connecting a static select signal to a dynamic route select output line when a dynamic select Configuration Random Access Memory (CRAM) signal is at a first logical level, wherein the static select signal is derived from a CRAM bit loaded from a configuration file for a programmable logic device (PLD);
   a second transistor connecting a dynamic select signal to the dynamic route select output line when the dynamic select CRAM signal is at a second logical level, wherein the dynamic select signal is configurable after the PLD has been programmed; and multiplexing circuitry with a first select signal connected to the dynamic route select output line.

2. The circuit as recited in claim 1 further comprising, an inverter whose input is connected to the second transistor gate and whose output is connected to the first transistor gate.

3. The circuit as recited in claim 2 further comprising, a dynamic select CRAM register containing a bit, the dynamic select CRAM register connected to the second transistor gate, wherein the dynamic select CRAM register bit generates the dynamic select CRAM signal.

4. The circuit as recited in claim 1 further comprising, a third transistor whose gate is connected to the gate of the first transistor, the third transistor connecting another static select signal to another dynamic route select output line; and a fourth transistor whose gate is connected to the gate of the second transistor, the fourth transistor connecting another dynamic select signal to the another dynamic route select output line;

wherein the multiplexing circuitry has a second select signal connected to the another dynamic route select output line.

5. The circuit as recited in claim 4 further comprising, a dynamic select CRAM register containing a bit, the dynamic select CRAM register connected to the second transistor gate, wherein the dynamic select CRAM register bit generates the dynamic select CRAM signal;

wherein the circuit is part of a Logic Element Input Multiplexer (LEIM) inside the PLD, wherein the another static select signal is derived from a second CRAM bit loaded from the configuration file of the PLD, whereby a dynamic multiplexer is implemented when the dynamic select CRAM register enables the second and fourth transistors.

6. The circuit as recited in claim 5, further comprising, a plurality of dynamic multiplexers, wherein the dynamic select signals are common to the plurality of dynamic multiplexers inside a Logic Array Bloc (LAB).

7. The circuit as recited in claim 6, wherein the LEIM comprises three inputs controlled by the dynamic route select output lines, the dynamic route select output lines causing the outputting of one of the inputs, whereby a 3:1 dynamic multiplexer is implemented.

8. The circuit as recited in claim 1, wherein the integrated circuit is a Programmable Logic Device (PLD).

9. The circuit as recited in claim 1, wherein the dynamic select signal is transferred from one of, a register outside the integrated circuit,
a register inside the integrated circuit,
a register inside a Field Programmable Gate Array (FPGA), and
a register inside a LAB.

10. A circuit for implementing a dynamic multiplexer by cascading multiplexers, the circuit comprising:

a set of first multiplexers having common select signals;
a second multiplexer receiving the outputs from the set of first multiplexers;
bypassing circuitry to selectively use one of dynamic select signals or static select signals for the second multiplexer; and a select circuit having connections from the outputs of the first multiplexers to the output of the second multiplexer, the connections being activated by sneak select signals;

wherein the first multiplexers are inside a plurality of LEIMs, wherein the outputs of the first multiplexers are outside a master LEIM, wherein the plurality of LEIMS includes the master LEIM and a slave LEIM, wherein the output of the second multiplexer is the output of a cascaded multiplexer inside the slave LEIM when a slave sneak select signal is activated, wherein the output of the second multiplexer is one of the outputs from the first multiplexers of the master LEIM when the slave sneak select signal is not activated;

wherein the select circuit further comprises, a sneak out transistor connecting the output of the cascaded multiplexer to the output of the second multiplexer, the gate of the sneak out transistor connected to the slave sneak select signal, and a sneak block transistor that disconnects the output of at least one first multiplexer in the master LEIM when the slave sneak select signal is activated, the sneak block transistor gate connected to an inverted signal of the slave sneak select signal.

11. The dynamic multiplexer circuit as recited in claim 10 further comprising a dynamic select circuit, the dynamic select circuit comprising, a dynamic select CRAM register,
an inverter whose input corresponds to a bit value of the dynamic select CRAM register,
a first transistor that connects a first static select signal to a first intermediate output line, the first transistor gate connected to the output of the inverter,
a second transistor that connects a second static select signal to a second dynamic select output line, the second transistor gate connected to the output of the inverter,
a third transistor that connects a first dynamic select signal to the first intermediate output line, the third transistor gate connected to the dynamic select CRAM register,
a fourth transistor that connects a second dynamic select signal to the second dynamic select output line, the fourth transistor gate connected to the dynamic select CRAM register,
a fifth transistor whose gate is connected to the first intermediate output line,
a sixth transistor whose gate is connected to the second dynamic select output line, the fifth and sixth transistors serially connecting a first logical value to generate the slave sneak select signal, the slave sneak select signal being connected to a second logical value via a weak pull resistor,
a second inverter whose input is the slave sneak select signal, and
a seventh transistor that connects the first intermediate output line to the first dynamic select output line, the gate of the seventh transistor connected to the output of the second inverter, the first dynamic select output line being connected to the second logical value via a second weak pull resistor.

12. The dynamic multiplexer circuit as recited in claim 11, wherein the master and the slave LEIMs comprise three first multiplexers each, the circuit further comprising, a second multiplexing circuit in the master LEIM, the second multiplexing circuit selecting one of the inputs from the first multiplexers in the master LEIM as determined by the first and second dynamic select output lines when the slave sneak select signal is inactive, or the output from the cascaded multiplexer when the sneak select signal is active, whereby a 4:1 dynamic multiplexer is created when the dynamic select CRAM register activates the third and fourth transistors.

13. A method for testing a multiplexer in an integrated circuit, the method comprising:

loading a logical value into a bypass register;

connecting select lines of a first multiplexer to static select signals when the bypass register has a first logical value, wherein the static select signals are derived from CRAM bits loaded from a configuration file for a programmable logic device (PLD); and connecting the select lines to dynamic select signals if the bypass register contains a second logical value, wherein the dynamic select signals are configurable after the PLD has been programmed, whereby the first multiplexer can be tested with the dynamic select signals while the programming of the PLD remains unchanged.

14. The method as recited in claim 13, wherein the dynamic select signals are derived from an input line to the integrated circuit.

15. The method as recited in claim 14, wherein there are two static select signals and two corresponding dynamic select signals.

16. The method as recited in claim 13, further including:

connecting the select lines of a second multiplexer to the static select signals when the bypass register has the first logical value; and connecting the select lines of the second multiplexer to the dynamic select signals when the bypass register contains the second logical value.

17. The method as recited in claim 16, further including a select circuit for selecting an output from the first multiplexer or an output from the second multiplexer, the selecting being associated with sneak select signals.

* * * * *